United States Patent
Ezell et al.

(10) Patent No.: US 6,462,327 B1
(45) Date of Patent: Oct. 8, 2002

(54) ANALOG OPTICAL RECEIVER AND VARIABLE GAIN TRANSIMPEDANCE AMPLIFIER USEFUL THEREWITH

(75) Inventors: R. William Ezell, Carrollton; Carey Ritchey, Plano, both of TX (US)

(73) Assignee: Microtune (Texas), L.P., Plano, TX (US)

( * ) Notice: Subject to any disclaimer, the term of this patent is extended or adjusted under 35 U.S.C. 154(b) by 0 days.

(21) Appl. No.: 09/967,694

(22) Filed: Sep. 27, 2001

(51) Int. Cl.[7] ............................................. H01J 40/14
(52) U.S. Cl. ............................. 250/214 A; 250/214 R
(58) Field of Search ....................... 250/214 A, 214 LA, 250/214 R; 330/59, 308, 110; 359/152, 154, 118

(56) References Cited

U.S. PATENT DOCUMENTS 5,602,510 A * 2/1997 Bayruns et al. ............. 330/282
5,646,573 A * 7/1997 Bayruns et al. ............. 330/59
5,994,955 A 11/1999 Birkeland

OTHER PUBLICATIONS

McGinn, Mike. "An Advanced I.F. Amplifier & AFT System Suitable for HDTV." IEEE Transactions on Consumer Electronics. vol. 36 No. 3 (Aug. 1990) 407–414.

Pratt, William J. "High Linearity HBT Amplifier Targets Multicarrier Systems" RF Design. (Mar. 1996). 47–54.
Giles, Martin. "The LM 1823: A High Quality TV Video I.F. Amplifier and Synchronous Detector for Cable Receivers." National Semiconductor Corporation. (Mar. 1985). 1–16.
Soorapanth, Theerachet and Thomas H. Lee. "RF Linearity of Short–Channel MOSFETs" Center for Intergrated Systems, Stanford University. 1–4 (No Date).
Kokozinski, Rainer, et al. "Microwave Wideband Amplifiers In Bulk–CMOS and CMOS/SIMOX Technologies." IEEE International Solid–State Circuits Conference. (1995). 146–147; 188–189 (Month Unknown).
Kimura, Katsuji. "The Ultra–Multi–Tanh Technique for Bipolar Linear Transconductance Amplifiers." IEEE Transactions on Circuits and Systems –1: Fundamental Theory and Applications. vol. 44, No. 4. (Apr. 1997). 288–302.

* cited by examiner

Primary Examiner—Que T. Le
(74) Attorney, Agent, or Firm—Fulbright & Jaworski L.L.P.

(57) ABSTRACT

Disclosed are systems and methods which provide signal processing circuitry utilizing a variable gain transimpedance amplifier configuration which is economical to implement and which provides for power efficient circuit implementation. Preferred embodiments provide a transimpedance amplifier having an output intercept that remains constant while a corresponding input intercept increases as gain is reduced. An analog optical receiver preferably implements an architecture in which the variable gain transimpedance amplifier is disposed as an input amplifier.

65 Claims, 2 Drawing Sheets

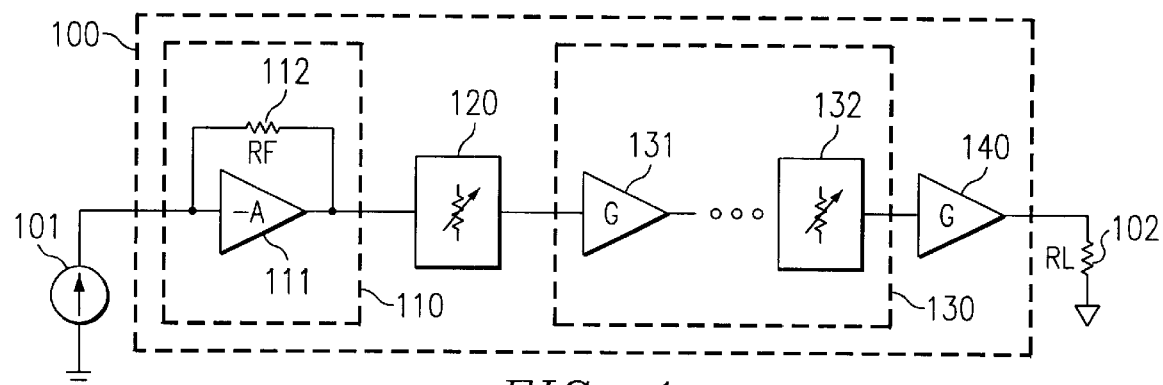
FIG. 1
*(PRIOR ART)*
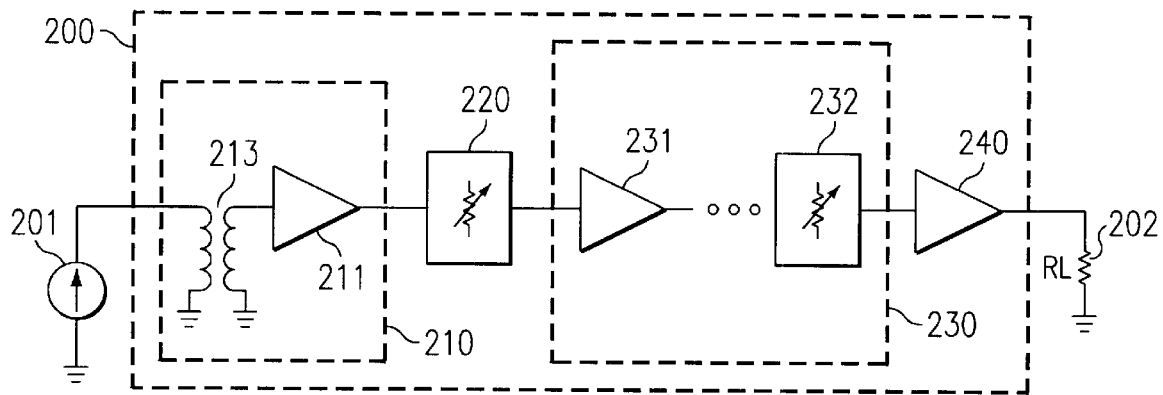
FIG. 2
*(PRIOR ART)*
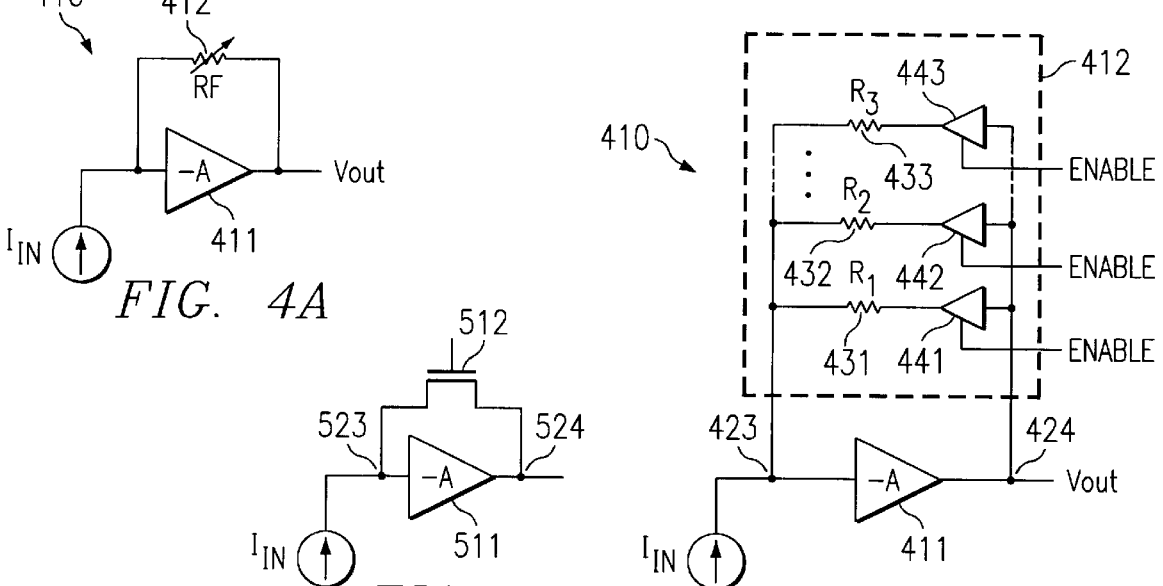
FIG. 4A
FIG. 5
*(PRIOR ART)*
FIG. 4B

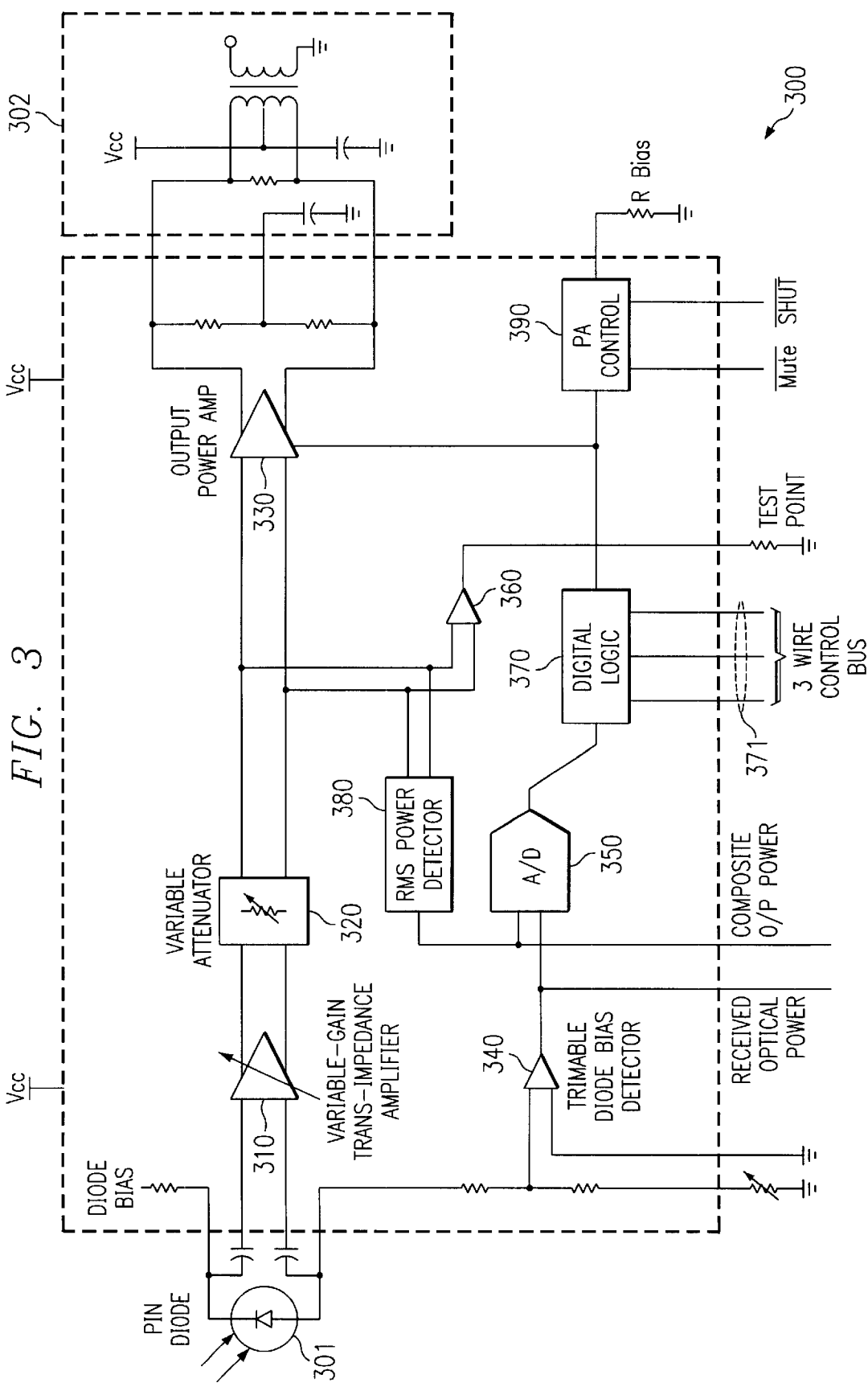

ANALOG OPTICAL RECEIVER AND VARIABLE GAIN TRANSIMPEDANCE AMPLIFIER USEFUL THEREWITH

RELATED APPLICATIONS

The present application is related to co-pending and commonly assigned U.S. patent application Ser. No. 09/572,393 entitled "Broadband Integrated Tuner," filed May 16, 2000, which is a continuation of U.S. patent application Ser. No. 08/904,908, now U.S. Pat. No. 6,177,964, entitled "Broadband Integrated Television Tuner," filed Aug. 1, 1997, the disclosures of which are hereby incorporated herein by reference.

TECHNICAL FIELD OF THE INVENTION

The invention relates generally to the communication of broadband signals and, more particularly, to the processing of signals carried in dissimilar media.

BACKGROUND OF THE INVENTION

Broadband communication systems in use today often utilize dissimilar media throughout the signal path of transmitted signals. For example, cable television infrastructure often utilizes fiber optic media for long haul transmission of broadband signals and coaxial cable or other electrically conductive media for signal processing, head-end connections, and/or subscriber premise connections. Accordingly, transmission of broadband signals including multiplexed television channel signals, data signals, such as Internet content data, pay per view data, and other data, may traverse various media including fiber optic cable, coaxial cable and other media.

Analog optical receivers have been used in the prior art to bridge an optical media and electrically conductive media such as an optical fiber and cable interface. An analog optical receiver typically takes a current generated from an optical PIN diode interfaced with a fiber optic signal path and creates a corresponding voltage for signal processing using electrically conductive media, e.g., input into a tuner or transmission via coaxial cable. However, the currents generated from optical PIN diodes are very small and the voltage output typically required for desired signal processing is very large comparatively. Moreover, the relationship of the output voltages to the input current must be highly linear with very low distortion. Accordingly, analog optical receivers used with broadband signals must be very low noise and very linear, as well as providing a large frequency response or bandwidth.

Analog optical receivers in existence today are discrete solutions, typically having a fixed gain input amplifier, a variable attenuator, and multiple stages of fixed gain amplifiers and variable attenuators. For example, prior art analog optical receivers often utilize a fixed gain transimpedance amplifier (TIA) coupled to a PIN diode attenuator followed by a plurality of fixed gain amplifiers and attenuators, the number of which depending upon the range of attenuation provided by the PIN diode attenuator and system gain required. TIAs are relied upon in such circuits to convert low-level photodiode currents to usable voltage signals. Alternative embodiments implemented in the prior art utilize a winding or transformer, to provide current gain, coupled to a fixed gain voltage amplifier, to provide voltage gain, in place of the above described transimpedance amplifier. Accordingly, a fixed gain transimpedance stage is again provided which is coupled to a variable attenuator according to this alternative prior art embodiment.

The above prior art analog optical receiver architectures suffer from several undesired characteristics. For example, because the variable attenuator is disposed in the circuit to attenuate the signal after the input amplifier, the input amplifier must have a very linear response. Specifically, the amplifier's output intercept point, a measure of the linearity of its output signal, is attenuated with a decrease in gain. Accordingly, the fixed gain amplifier must have an output intercept that is much greater than is actually required to provide proper signal quality by the maximum amount of attenuation to be utilized. That is, assuming a design criteria of a third order output intercept (OIP3) equal to 0 dBm in an analog optical receiver with a PIN diode attenuator providing variable attenuation up to 20 dB, the input amplifier must provide an OIP3 of 20 dBm (0 dBm as required by system parameters plus 20 dBm attenuated worst case by the variable attenuator). In the above example, the input amplifier's input intercept, which is equal to the device's output intercept minus its gain, would remain constant.

As the output intercept of a circuit component is a measure of linearity, the prior art analog optical receivers require input amplifiers which are considerably more linear than design parameters otherwise require. Typically such highly linear amplifiers are more costly and difficult to implement and result in higher power consumption circuit designs than is desired. Moreover, the output intercept is effectively variable with gain, i.e., the input amplifier and variable attenuator circuit output intercept increases with signal gain.

A need therefor exists in the art for analog optical receivers which provide desired signal processing attributes and which may be economically implemented. A further need exists in the art for such analog optical receivers to implement architectures which are power efficient.

A still further need exists in the art for a transimpedance amplifier configuration adapted to provide amplification of a current source signal to voltage levels suitable for further signal processing without an associated variation in output intercept.

BRIEF SUMMARY OF THE INVENTION

The present invention is directed to systems and methods which provide signal processing circuitry utilizing an amplifier configuration which is economical to implement and which provides for power efficient circuit implementation. Preferred embodiments of the present invention provide an amplifier having an output intercept that remains constant while a corresponding input intercept increases as gain is reduced. A most preferred embodiment of the present invention provides a constant output intercept, variable gain, transimpedance amplifier.

For example, an analog optical receiver of the present invention preferably implements an architecture in which a variable gain transimpedance amplifier is disposed as an input amplifier. According to this preferred embodiment analog optical receiver, the linearity requirements of circuitry, such as the amplifier circuitry itself and a variable attenuator coupled to the amplifier circuitry, are lessened, thereby providing advantages such as ease of implementation, ability to implement the circuits as integrated circuits, and reduced manufacturing costs.

Moreover, as the role of a typical optical receiver is to present a constant output voltage or power under varying input optical power conditions by varying the gain of the optical receiver, the preferred embodiment configuration is particularly useful in analog optical receiver implementations because the output intercept remains constant and the input intercept increases as signal gain is decreased. Specifically, as the input power to the optical receiver increases, the gain must be reduced, and therefore, it is desirable that the input intercept, which relates to the maximum input signal for a given linearity, increases with decreasing gain to cope with the increasing input power.

Preferred embodiments of the present invention utilize a high gain amplifier effectively implementing a variable resistor feedback network. For example, a variable resistor feedback network may be provided according to the present invention through a piece-wise linear resistor function. Variable resistor feedback may be implemented by switching in various values of resistance through use of buffer stages, if desired.

Transimpedance amplifiers of the present invention are preferably readily implemented in an integrated circuit, such as upon a silicon substrate. For example, linearity requirements of particular circuits, such as the aforementioned analog optical receiver circuits, are attainable implementing a variable gain transimpedance amplifier of the present invention which is less complicated, and therefore simpler to construct monolithically, than a typical amplifier implemented according to the prior art. Moreover, as preferred embodiment analog optical receivers of the present invention implement an architecture in which a highly linear variable attenuator, such as the aforementioned PIN diode attenuator, is not required, preferred embodiments of the present invention provide for complete integrated circuit implementation of circuits associated therewith. For example, an analog optical receiver of the present invention may be fully integrated on a single silicon substrate. In contrast, in addition to input amplifiers providing sufficient linearity for prior art analog optical receiver architectures being difficult to implement in an integrated circuit, the PIN diode attenuators required by such architectures are typically impractical to implement in an integrated circuit and, therefore are implemented in discrete components.

A technical advantage of the present invention is that analog optical receivers configured to provide desired signal processing attributes may be economically implemented. A further technical advantage of the present invention is that preferred embodiment analog optical receivers implemented according to the present invention are power efficient.

A still further technical advantage of the present invention is that a preferred embodiment transimpedance amplifier configuration provides amplification of a current source signal to voltage levels suitable for further signal processing without an associated variation in output intercept.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 1 shows a typical prior art analog optical receiver architecture;

FIG. 2 shows another typical prior art analog optical receiver architecture;

FIG. 3 shows a preferred embodiment analog optical receiver architecture according to the present invention;

FIGS. 4A and 4B show preferred embodiment schematic diagrams of a variable gain transimpedance amplifier of the present invention; and FIG. 5 shows a schematic diagram of a variable gain transimpedance amplifier believed to be known in the prior art.

DETAILED DESCRIPTION OF THE INVENTION

In order to better understand the present invention, a brief description of various prior art circuits to which the concepts of the present invention are particularly applicable provided hereinbelow. Directing attention to FIG. 1, a typical prior art analog optical receiver architecture is shown as including current source 101, receiver 100, and load 102. Current source 101 is typically provided by an optical PIN diode coupled to a fiber optic transmission line to receive a light signal and convert the received signal to a corresponding current. Load 102 may be any of a number of circuits for further processing of the received signal.

Receiver 100 of FIG. 1 includes fixed gain transimpedance amplifier 110 coupled to current source 101 to provide amplification of a current applied thereto to a corresponding voltage level useful for desired signal processing. Specifically, TIA 110 includes negative gain amplifier 111 and feedback resistor 112. The value of feedback resistor 112, together with the gain of amplifier 11, establishes the gain provided by transimpedance amplifier 110. Assuming a large enough gain of amplifier 111, the gain of TIA 110 is substantially controlled by the value of resistor 112, as amplifier 111's contribution may be neglected.

Transimpedance amplifier 110 of receiver 100 is coupled to variable attenuator 120 to provide controlled attenuation of the signal output by the fixed gain transimpedance amplifier. It should be appreciated that because variable attenuator 120 provides the complete range of gain adjustment associated with TIA 110 in the architecture of receiver 100, variable attenuator 120 provides a relatively large range of attenuation. Moreover, variable attenuator 120 must be relatively high power as well as highly linear and, therefore, is typically implemented as a PIN diode attenuator.

Variable attenuator 120 is followed in receiver 100 by gain stage 130, such as may include any number of fixed gain amplifiers, such as amplifier 131, and/or attenuators, such as attenuator 132. The particular configuration of gain stage 130 will be driven by design requirements for gain range and overall gain. Gain stage 130 is followed in receiver 100 by output power amplifier 140 to drive load 102.

Another version of a typical prior art analog optical receiver architecture is shown in FIG. 2 as including current source 201, receiver 200, and load 202. Current source 201 and load 202 are typically as described above with respect to current source 101 and load 102. Receiver 200, although being configured similarly to receiver 100 described above, does not use a transimpedance amplifier, but instead, utilizes fixed gain transimpedance stage 210.

Fixed gain transimpedance stage 210 provides the functionality of fixed gain transimpedance amplifier 110 of FIG. 1 using transformer 213 and fixed voltage amplifier 211. In operation, transformer 213 steps up the current provided by current source 201 for providing to fixed voltage amplifier 211. Fixed voltage amplifier 211 provides amplification of the signal to a corresponding voltage level useful for desired signal processing.

As with transimpedance amplifier 110 of FIG. 1, fixed gain transimpedance stage 210 of receiver 200 is coupled to variable attenuator 220 to provide controlled attenuation of the signal output by the fixed gain transimpedance stage. As with variable attenuator 120 discussed above, because variable attenuator 220 provides the complete range of gain adjustment associated with transimpedance amplifier 210 in the architecture of receiver 200, variable attenuator 220 provides a relatively large range of attentation. Moreover, variable attenuator 220 must be relatively high power as well as highly linear and, therefore, is typically implemented as a PIN diode attenuator.

Variable attenuator 220 is followed in receiver 200 by gain stage 230, such as may include any number of fixed gain amplifiers, such as amplifier 231, and/or attenuators, such as attenuator 232. The particular configuration of gain stage 230 will be driven by design requirements for gain range and overall gain. Gain stage 230 is followed in receiver 200 by output power amplifier 240 to drive load 202.

The prior art analog optical receiver architectures necessarily require the use of a relatively very linear and higher power amplifier at the receiver input stage, i.e., the transimpedance amplifier or transimpedance stage, because the variable attenuator immediately following the receiver input stage effectively reduces the output linearity of the receiver input stage amplifier. Specifically, in operation the output intercept characteristic of these prior art configurations will effectively decrease with increased attenuation, i.e., as the gain decreased the output intercept will also decrease.

It should be appreciated that, although the input intercept is related to the output intercept by the intervening gain, because the variable resistor architecture of the prior art provides an effective decrease in output intercept and, thus, the input intercept in the above architectures remain constant. However, it is preferable to have an input intercept which is increased as the gain is reduced because the role of a typical optical receiver is to present a constant output voltage or power under varying input optical power conditions by varying the gain of the optical receiver.

Directing attention to FIG. 3, an analog optical receiver adapted according to a preferred embodiment of the present invention is shown as receiver 300. As with the prior art analog optical receivers described above, receiver 300 of the present invention is preferably coupled to an optical PIN diode, current source 301, to accept an input signal therefrom and is further coupled to an output load, load 302, to which a signal processed by receiver 300 is provided. It should be appreciated that a variety of input sources and output loads may be utilized with the present invention in addition to or in the alternative to those illustrated in FIG. 3. For example, there is no limitation to the use of a PIN diode as a current source according to the present invention. Load 302 may be any of a number of signal processing circuits including a tuner, such as shown and described in the above referenced patent application entitled "Broadband Integrated Tuner," a modem, etcetera, or signal communication infrastructure, such as a transmission line, network router, network gateway, etcetera.

Receiver 300 of FIG. 3 includes variable gain transimpedance amplifier 310, a preferred embodiment of which will be described in further detail below with respect to FIGS. 4A and 4B, coupled to current source 301. Variable gain TIA 310 is coupled to variable attenuator 320, which provides fine adjustment of signals from TIA 310. Variable attenuator 320 is coupled to output power amplifier 330 that drives external load 302. Digital logic 370 is preferably provided for receiver control. For example, digital logic 370 will preferably control the gain of receiver 300, such as by control signals provided to control bus 371 being interpreted by digital logic 370 for corresponding control signals to be provided to enable feedback path portions of variable gain transimpedance amplifier 310 and/or to control variable attenuator 320.

The preferred embodiment analog optical receiver architecture of FIG. 3 achieves a constant, high output linearity while reducing greatly the amount of DC power consumption over the prior art architectures described above. Moreover, the preferred embodiment architecture provides for low input referred noise.

Referring to FIG. 4A, variable gain transimpedance amplifier 410, as may be implemented as variable gain TIA 310 of analog optical receiver 300, is shown schematically. Variable gain TIA 410 preferably includes variable resistor 412 providing feedback with respect to amplifier 411, preferably an amplifier providing a relatively large value negative gain. Amplifier 411's gain is preferably significantly higher than the specified transimpedance of transimpedance amplifier 410. TIA 410's gain is then set by resistor 412. For example, a maximum transimpedance gain of 1000 V/A is often require in practice. This would suggest resistor 412's maximum value to be on the order of 1 kΩ and gain of greater than 10,000 V/A with respect to amplifier 411. For the variable gain TIA 410 to be able to provide 20 dB of gain reduction from its maximum value of 1000 V/A, variable resistor 412 would preferably provide 20 dB less resistance, or 100Ω.

The gain provided by variable gain transimpedance amplifier 410 is defined as:

$$G = V_{out}/I_{in}$$

where G is the gain provided by the transimpedance amplifier, $I_{in}$ is the current input by a coupled current source, such as an optical PIN diode, and $V_{out}$ is the output voltage of the signal amplified by the transimpedance amplifier. Assuming a large enough negative gain in amplifier 411, the gain of transimpedance amplifier 410 may be approximated as:

$$G = R_F$$

where $R_F$ is the feedback resistance. From the above, it can be seen that as the feedback resistance $R_F$ is reduced the gain of variable gain transimpedance amplifier 410 is reduced.

FIG. 4B shows a preferred embodiment implementation of variable gain transimpedance amplifier 410. The preferred embodiment of FIG. 4B utilizes a plurality of resistors in the feedback path, one or more of which being controllably selectable. Specifically, the illustrated embodiment includes feedback resistors 431–433, each having a corresponding one of buffer amplifiers 441–443 coupled thereto, in the feedback path of amplifier 411. Feedback resistors 431–433 may preferably be switched into and out of the feedback loop by application of an enable signal to amplifiers 441–443, respectively. Preferably, of the feedback path portions making up the feedback path of variable gain transimpedance amplifier 410, at least one feedback path portion is always enabled. However, the feedback path portions (resistor 431 and amplifier 441, resistor 432 and amplifier 442, and resistor 433 and amplifier 443) may be enabled in any combination desired to provide piecewise variable resistance.

It should be appreciated that, although three feedback path portions and thus three feedback resistors have been shown in the illustrated embodiment, the present invention is not limited to any particular number of resistor values in the feedback path of a variable gain transimpedance amplifier of the present invention, nor in the combination in which the feedback resistors are switched. Accordingly, variable gain transimpedance amplifiers may be configured according to the present invention to include more or less than the three feedback resistors shown. Moreover, the present invention is not limited to use of resistors of any particular value. Accordingly, resistors of each feedback path portion may be of any value and any combination of values suitable for providing gain control according to the present invention.

In the illustrated embodiment, buffer amplifiers 441–443 are preferably adapted to be enabled and disabled. When the buffer amplifiers are enabled, they preferably provide no loss and, therefore, it is as if the corresponding resistance value has been coupled between nodes 423 and 424 of variable gain transimpedance amplifier 410. If each of the buffer amplifiers are enabled, each of feedback resistors 431–433 will effectively be coupled in parallel between nodes 423 and 424. Assuming each of the resistors are the same value, then the effective resistance will be ⅓ that of the resistor value, thereby providing the lowest gain setting for the illustrated configuration. An increased gain setting may be selected by disabling either one of buffer amplifiers 442 or 443, leaving feedback resistor 431 and one of feedback resistors 432 or 443 in the feedback path. A maximum gain setting may be selected by disabling each of buffer amplifiers 442 and 443, leaving only feedback resistor 431 in the feedback path and, therefore, providing the largest resistance configuration and correspondingly the maximum gain. Stated another way, for maximum gain $R_F=R_1$, for intermediate gain $R_F=R_1 \| R_2$ or one-half of maximum, and for minimum gain $R_F=R_1 \| R_2 \| R_3$ or one-third of maximum.

Alternatively, resistors 431–433 may be sized to provide a specified resistance such that the desired gain may be achieved when only one feedback path is enabled at a time. According to a preferred embodiment, the desired gain steps may be logarithmic in nature. For example, assume that resistor 432 has a resistance that is a factor of 2 times that of resistor 433, and resistor 431 has a resistance that is a factor of 2 times that of resistor 432. A maximum gain setting may be selected by only enabling buffer amplifier 441, leaving only feedback resistor 431. A gain of 6 dB less than maximum, or half, may be achieved by only enabling buffer amplifier 442. A gain of 12 dB less than maximum, or one-quarter, will be had by enabling buffer amplifier 443, putting resistor 433 in the feedback path. As can be seen, the above resistor configuration would give a logarithmic step size of 6 dB.

It should be appreciated that the above described configuration of variable gain transimpedance amplifier 410 provides a piece-wise variable gain function having a constant output intercept and an input intercept that increases as gain is decreased. Accordingly, the linearity requirements with respect to transimpedance amplifier 410 are driven directly by the design requirements of the analog optical receiver rather than some factor thereof associated with the worst case output intercept associated with the use of the variable attenuator architecture of the prior art. Moreover, such an amplifier configuration is more efficient with respect to power consumption as a significant amount of power is not being dissipated by a variable attenuator providing full gain control with respect to the transimpedance amplifier output. Such amplifiers are more readily implemented in an integrated circuit receiver embodiment than those meeting the linearity and power requirements of the prior art architectures. As will be appreciated further from the discussion below with respect to a preferred embodiment integrated circuit implementation, a synergy with respect to implementing such a receiver in a integrated circuit exists to provide features and benefits not possible in the prior art.

In order to provide fine gain adjustment or intermediate gain adjustment to the piece-wise variable gain of the above described configuration of variable gain transimpedance amplifier 410, preferred embodiments of the invention implement a variable attenuator coupled to the output of the transimpedance amplifier. For example, variable attenuator 320 shown in FIG. 3 is provided to implement smaller gain adjustment between the gain increments realized by enabling/disabling resistors in the feedback path as described above. In such a configuration the attenuation values provided by a variable attenuator such as variable attenuator 320 may be relatively small as compared to the overall gain range of the system. For example, in the above example where $R_1=R_2=R_3$, variable attenuator 320 may provide adjustable attenuation in the range between what may be achieved from using these resistances and, thus, in combination with enabling/disabling of resistors $R_1$, $R_2$, and $R_3$, provide for selection of incremental values of gain throughout the gain range of the amplifier configuration.

As discussed above, variable attenuator 320 preferably has a relatively small attenuation range associated therewith. Accordingly, the use of variable attenuator 320 with variable transimpedance amplifier 410 does not significantly impact the constant output intercept associated therewith. Moreover, because variable gain transimpedance amplifiers of preferred embodiments of the present invention provide variable gain with constant output intercept, the linearity requirements of variable attenuator 320 are relatively low, eliminating the need for the aforementioned PIN diode attenuators of the prior art and facilitating an integrated circuit receiver embodiment as is described in further detail below. Additionally, as the majority of gain adjustment is provided by the variable gain transimpedance amplifier of this preferred architecture, variable attenuator 320 may be implemented without the use of high power configurations.

It is believed that the prior art includes a variable gain transimpedance amplifier configuration which uses a FET device in the feedback path. However, it should be appreciated that such a variable gain transimpedance amplifier configuration is generally not suitable for use according to the present invention. Specifically, variable gain transimpedance amplifier configurations implementing a FET device in the feedback path typically do not provide a broadband response consistent with that of the present invention, as is desirable for use in cable television signal processing and the like.

Directing attention to FIG. 5, a variable gain transimpedance amplifier configuration implementing a FET device in the feedback path, as is believed to be known in the prior art, is shown as transimpedance amplifier 510. Transimpedance amplifier 510 includes FET device 512 providing feedback with respect to amplifier 511. As FET device 512 is pinched off, through control of a gate voltage applied thereto, the FET device will give a higher resistance. As the resistance provided in the feedback path by FET device 512 is increased, a higher gain is provided by transimpedance amplifier 510. Conversely, as the resistance provided in the feedback path by FET device 512 is decreased, a lower overall gain is provided by transimpedance amplifier 510.

Although this FET device implementation generally has desirable output and intercept characteristics, it should be appreciated that the configuration suffers from a fundamental bandwidth limitation. Specifically, because the FET device uses an oxide and plate, the FET device provides capacitance to nodes 523 and 524. It should be appreciated that the more capacitance provided at the transimpedance amplifier input node, node 523, the lower the overall bandwidth of the transimpedance amplifier. Accordingly, a fundamental limitation of the bandwidth of this transimpedance amplifier configuration is based upon how large the FET device disposed in the feedback path is. However, a designer typically does not have the freedom to reduce this input capacitance by selecting a relatively small FET device for providing feedback because in a variable gain transimpedance amplifier configuration to be utilized according to the present invention it is generally desirable to provide both high gain and low gain. In providing high gain, a large resistance is used in the feedback path, so a small FET device may suffice. However, in providing low gain, a small resistance is used in the feedback path, so a large FET device is required. In order to provide for both ends of the gain spectrum, a designer must provide for the worst case and, therefore, must implement the large FET device capable of providing the small resistance of the low gain configuration. However, the large FET device will provide the most capacitance, which is the least desirable where broadband response is desired.

Further, while this FET implementation generally has the desired output versus input intercept relation, the linearity performance will be limited by non-linearities in the FET device itself. This is due to the fact that any non-linear device placed in the feedback path of a transimpedance amplifier affects the amplifier's overall linearity. An FET is by its very nature non-linear, and will therefore limit the distortion performance of amplifier 510.

It should be appreciated that the preferred embodiment variable gain transimpedance amplifier configuration of FIG. 4B results in no additional appreciable capacitance associated with the variable resistance feedback path at input node 423. Accordingly, this preferred embodiment configuration provides superior bandwidth response as compared to the transimpedance amplifier configuration of FIG. 5. Accordingly, preferred embodiment variable gain transimpedance amplifiers of the present invention are well suited for use in broadband applications, such as the aforementioned television cable signal processing applications. Further, the configuration of FIG. 4B uses a linear resistor as a feedback mechanism, which does not limit the linearity performance of the embodiment as compared to the performance of FIG. 5.

Moreover, as mentioned above, preferred embodiment variable gain transimpedance amplifiers of the present invention are well suited for integrated circuit implementation. Specifically, due to the higher performance transimpedance amplifier of the present invention, i.e., the providing of variable gain with constant output intercept, both the transimpedance amplifier and associated receiver circuitry, such as a variable attenuator coupled thereto having lowered linearity requirements associated therewith, are more readily integrated onto a single substrate. In contrast, the prior art uses, for instance, an external pin diode attenuator, which is much more linear and very difficult to integrate on chip. Accordingly, the components of receiver 300 shown in FIG. 3 may be implemented on a common substrate to thereby provide an integrated circuit receiver according to a preferred embodiment of the present invention. By integrating the preferred embodiment functions onto a single substrate, a receiver configuration which is highly commercial because of its robust feature set as well as its improved operation and economic manufacturing cost may be provided.

For example, digital logic 370, in addition to providing control with respect to the operation of receiver 300 as discussed above, preferably provides various information monitoring/reporting fimctions with respect to receiver 300 as may be synergistically implemented in the integrated circuit preferred embodiment. Accordingly, digital logic 370 of preferred embodiments provide monitoring of the power output (preferably RMS power output) of the receiver and/or the input power (preferably DC input power) received from a current source coupled thereto, such as the aforementioned optical PIN diode. For example, the illustrated embodiment includes RMS power detector 380 coupled to digital logic 370 to provide RMS power information thereto. Analog to digital converter 350 preferably accepts the RMS power detector result and digitizes the information for providing to digital logic 370 and/or for outputting on bus 371. Similarly, analog to digital converter 350 of the illustrated embodiment accepts an optical PIN diode current measurement and digitizes the information for providing to digital logic 370 and/or for outputting on bus 371.

According to a preferred embodiment, RMS power detector 380 may be provided in the integrated circuit design of receiver 300 to thereby provide a more accurate result and higher dynamic range than is possible in a typical discrete component prior art receiver implementation. Specifically, RMS power detector 380 will have lower noise injection into the rest of the circuit because it is designed on a single substrate and does not require signal processing off chip and, therefore, will be less susceptible to external influence. Moreover, better matching of the result and more predictable repeatability is available using an integrated implementation as in the preferred embodiment.

Digital logic 370 of the preferred embodiment provides various control functions in addition to or in the alternative to the aforementioned receiver gain control functions described above. For example, digital logic 370 may include control functions to mute the output and/or to put the receiver into shutdown.

The illustrated embodiment of receiver 300 further includes a −20 dBc RF test point, such as may be useful in allowing a user to troubleshoot operation of receiver 300. In the preferred embodiment integrated circuit receiver configuration, the RF test point is driven by amplifier 360 coupled between the variable gain transimpedance amplifier and the final gain stage of the receiver. A purpose of the test point is to allow users to measure the output power of the receiver without disturbing the actual output, such as by connecting test cables etcetera. Prior art receiver circuits, in contrast to the preferred embodiment architecture illustrated, generally require the use of a lossy tap connected at the output of the receiver, e.g., after final gain stage 330, to provide such an RF test point. However, such a configuration actually changes the operating load of the receiver and, therefore, the RF measurements provided thereby may not accurately reflect the operation of the receiver. The preferred embodiment integrated circuit receiver architecture provides the RF test point in such a way that it is attached in the signal path substantially without loading the circuit and, thus, better overall accuracy is provided with respect to the RF measurements. Accordingly, by utilizing the preferred embodiment integrated circuit receiver architecture, a very accurate signal representation is provided at the RF test point due in part to the much better matching of gains than can be achieved in discrete device architecture as in the prior art.

Accordingly, it should be appreciated that implementation of a variable gain transimpedance amplifier according to the present invention not only provides an excellent broadband transimpedance amplifier configuration, but has additional advantages associated therewith providing a synergy in configuring associated receiver circuitry. As discussed above, the preferred embodiment variable gain transimpedance amplifier is well suited for being fully implemented in an integrated circuit. Moreover, attributes of preferred embodiment transimpedance amplifiers of the present invention, such as the constant output intercept associated with embodiments described herein, facilitate the full integration of circuitry associated therewith, such as a variable attenuator of a receiver architecture. Full integration of such circuitry further facilitates ancillary advantages, such as the ability to provide accurate power detection and/or RF signal monitoring as described above.

Although the illustrated embodiment receiver circuit of FIG. 3 shows a PIN diode current source coupled thereto externally, it should be appreciated that the present invention is not so limited. For example, a current source other than a PIN diode, whether or not an optical diode, may be utilized according to the present invention. Additionally or alternatively, embodiments of the present invention may provide such a current source as part of a fully integrated receiver of the present invention. Likewise, additional circuitry, such as load 302, may be integrated on same substrate as is receiver 300. For example, integrated circuit tuner circuitry, such as shown and described in the above referenced patent application entitled "Broadband Integrated Tuner," may be fully integrated with receiver 300.

Moreover, although preferred embodiment variable gain transimpedance amplifiers have been described herein with reference to use in an analog optical receiver, it should be appreciated that variable gain transimpedance amplifiers of the present invention may be utilized with a variety of attendant circuitry, whether or not comprising an analog optical receiver and/or whether or not coupled to an optical diode.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for providing broadband transimpedance amplification with a substantially constant output intercept, said system comprising:
   a negative gain amplifier having an input and an output; and
   a variable attenuator feedback network coupling said output to said input, wherein said variable attenuator feedback network includes a plurality of resistors disposed in discrete feedback path portions of said feedback network.

2. The system of claim 1, wherein gain provided by said amplifier is in the range of approximately 100 V/A to 1000 V/A.

3. The system of claim 1, wherein resistance provided by each resistor of said plurality of resistors is in the range of approximately 1000 ohms to 100 ohms.

4. The system of claim 1, wherein each said resistor of said plurality of resistors provides a same resistance.

5. The system of claim 1, which said plurality of resistors provide a logarithmic progression of resistance.

6. The system of claim 1, wherein one or more of said resistors of said plurality of resistors are selectively enabled/disabled in said feedback network.

7. The system of claim 6, wherein at least two of said resistors of said plurality of resistors are selectively enabled/disabled in said feedback network to thereby provide more than two selectable gain levels.

8. The system of claim 6, wherein said variable attenuator feedback network further includes a plurality of buffer amplifiers disposed in said discrete feedback path portions of said feedback network.

9. The system of claim 8, wherein one or more of said buffer amplifiers have an enable/disable signal input associated therewith, wherein providing an enable signal to said enable/disable signal input selectively enables a corresponding one of said plurality of resistors in said feedback network.

10. The system of claim 8, wherein one or more of said buffer amplifiers have an enable/disable signal input associated therewith, wherein providing a disable signal to said enable/disable signal input selectively disables a corresponding one of said plurality of resistors in said feedback network.

11. The system of claim 1, wherein said amplifier and said variable attenuator feedback network are integrated upon a same substrate to thereby provide an integrated circuit implementation.

12. The system of claim 1, wherein said input is coupled to a current source providing relatively low current thereto and said output provides relatively high voltage signals in response thereto.

13. The system of claim 1, wherein said input is coupled to an optical diode.

14. The system of claim 13, wherein said optical diode is disposed to receive broadband light signals.

15. The system of claim 14, wherein said broadband light signals comprise cable transmission system signals.

16. The system of claim 15, wherein said cable transmission signals comprise cable television broadcast signals.

17. The system of claim 15, wherein said cable transmission signals comprise cable television return path signals.

18. The system of claim 15, wherein said cable transmission signals comprise cable modem signals.

19. The system of claim 1, wherein said output is coupled to a variable attenuator.

20. The system of claim 19, wherein said variable attenuator is implemented on a same substrate as said amplifier and said variable attenuator feedback network to thereby provide an integrated circuit implementation.

21. An analog optical receiver system comprising:
an input interface;
a variable gain transimpedance amplifier coupled to said input interface, wherein said transimpedance amplifier accepts a current input at said input interface and outputs a voltage responsive thereto; and
an output interface coupled to said transimpedance amplifier providing output of a signal corresponding to said voltage output by said transimpedance amplifier.

22. The system of claim 21, wherein said input interface is coupled to an optical diode providing said current input.

23. The system of claim 21, wherein said transimpedance amplifier has a relatively broadband response.

24. The system of claim 23, wherein said transimpedance amplifier comprises:
a variable attenuator feedback network coupling output of an amplifier to an input of said amplifier.

25. The system of claim 24, wherein said amplifier of said transimpedance amplifier comprises a negative gain amplifier.

26. The system of claim 24, wherein said variable attenuator feedback network includes a plurality of resistors disposed in discrete feedback path portions of said feedback network.

27. The system of claim 26, wherein each said resistor of said plurality of resistors provides a same resistance.

28. The system of claim 26, wherein said plurality of resistors provide a logarithmic progression of resistance.

29. The system of claim 26, wherein one or more of said resistors of said plurality of resistors are selectively enabled/disabled in said feedback network to thereby provide selectable gain levels with respect to said transimpedance amplifier.

30. The system of claim 29, wherein said variable attenuator feedback network further includes a plurality of buffer amplifiers disposed in said discrete feedback path portions of said feedback network.

31. The system of claim 30, wherein one or more of said buffer amplifiers have an enable signal input associated therewith, wherein providing an enable signal to said enable signal input selectively enables a corresponding one of said plurality of resistors in said feedback network.

32. The system of claim 30, wherein one or more of said buffer amplifiers have a disable signal input associated therewith, wherein providing a disable signal to said disable signal input selectively disables a corresponding one of said plurality of resistors in said feedback network.

33. The system of claim 21, further comprising:
an output amplifier coupled in a signal path between said transimpedance amplifier and said output interface.

34. The system of claim 33, wherein said input interface, said transimpedance amplifier, said output amplifier, and said output interface are integrated upon a same substrate to thereby provide an integrated circuit implementation.

35. The system of claim 21, further comprising:
a variable attenuator coupled in a signal path between said transimpedance amplifier and said output interface.

36. The system of claim 35, wherein said input interface, said transimpedance amplifier, said variable attenuator, and said output interface are integrated upon a same substrate to thereby provide an integrated circuit implementation.

37. The system of claim 35, wherein a range of attenuation provided by said variable attenuator is selected to substantially correspond to an increment of selectable gain provided by said transimpedance amplifier.

38. The system of claim 21, further comprising:
a digital controller coupled to said transimpedance amplifier and operable to provide a control signal thereto for selection of a desired amount of gain to be provided by said transimpedance amplifier.

39. The system of claim 38, further comprising:
a power detector coupled to a signal path between said transimpedance amplifier and said output interface, wherein said power detector is also coupled to said digital controller for providing signal output power information thereto.

40. The system of claim 38, for the comprising:
a received optical power detector coupled to said input interface, wherein said received optical power detector is also coupled to said digital controller for providing received optical power information thereto.

41. The system of claim 38, wherein said input interface is also coupled to said digital controller for providing signal input information thereto.

42. The system of claim 21, further comprising:
an RF test point amplifier coupled to a signal path between said transimpedance amplifier and said output interface and operable to provide an RF test signal substantially without affecting output of a signal at said output interface.

43. The system of claim 42, wherein said input interface, said transimpedance amplifier, said RF test point amplifier, and said output interface are integrated upon a same substrate to thereby provide an integrated circuit implementation.

44. A method of receiving a broadband optical signal and providing a corresponding electrical signal for further signal processing, said method comprising:
receiving said broadband optical signal at a photo diode;
inputting a current corresponding to said broadband optical signal output from said photo diode to a variable gain transimpedance amplifier;
selectively controlling a gain of said variable gain transimpedance amplifier using a linear feedback mechanism; and
outputting a voltage corresponding to said current.

45. The method of claim 44, wherein said selectively controlling a gain of said variable gain transimpedance amplifier comprises:
selectively enabling a feedback path portion of a feedback network of said variable gain transimpedance amplifier.

46. The method of claim 45, wherein said selectively enabling a feedback path portion comprises:
enabling a buffer amplifier associated with said feedback path portion.

47. The method of claim 44, further comprising:
selectively controlling attenuation of a signal provided by said variable gain transimpedance amplifier.

48. The method of claim 47, wherein said selectively controlling said attenuation provides gain adjustment between piece-wise gain increments provided by said variable gain transimpedance amplifier.

49. The method of claim 44, wherein said broadband optical signal comprises a cable television broadcast signals.

50. The method of claim 44, wherein said broadband optical signal comprises a cable television return path signal.

51. The method of claim 44, wherein said broadband optical signal comprises a cable modem signal.

52. An integrated circuit receiver comprising:
a variable gain transimpedance amplifier;
a variable attenuator coupled to said transimpedance amplifier; and
an output amplifier coupled to said variable attenuator, wherein said variable gain transimpedance amplifier, said variable attenuator, and said output amplifier are disposed upon a same semi-conductor substrate to thereby provide an integrated circuit.

53. The receiver of claim 52, wherein said variable gain transimpedance amplifier is coupled to an optical diode.

54. The receiver of claim 53, wherein said optical diode is disposed on said semi-conductor substrate.

55. The receiver of claim 52, wherein said transimpedance amplifier has a relatively broadband response.

56. The receiver of claim 55, wherein said variable gain transimpedance amplifier comprises:
a variable attenuator feedback network coupling output of an amplifier to an input of said amplifier.

57. The receiver of claim 56, wherein said amplifier of said variable gain transimpedance amplifier comprises a negative gain amplifier.

58. The receiver of claim 56, wherein said variable attenuator feedback network includes a plurality of resistors disposed in discrete feedback path portions of said feedback network.

59. The receiver of claim 52, wherein a range of attenuation provided by said variable attenuator is selected to substantially correspond to an increment of selectable gain provided by said variable gain transimpedance amplifier.

60. The receiver of claim 52, further comprising:
a digital controller coupled to said transimpedance amplifier and operable to provide a control signal thereto for selection of a desired amount of gain to be provided by said transimpedance amplifier.

61. The receiver of claim 60, further comprising:
a power detector coupled to a signal path between said transimpedance amplifier and said output interface, wherein said power detector is also coupled to said digital controller for providing signal output power information thereto.

62. The receiver of claim 60, further comprising:
a received optical power detector coupled to said input interface, which said received optical power detector is also coupled to said digital controller for providing received optical power information thereto.

63. The receiver of claim 60, wherein said input interface is also coupled to said digital controller for providing signal input information thereto.

64. The receiver of claim 52, further comprising:
an the RF test point amplifier coupled to a signal path between said transimpedance amplifier and said output interface and operable to provide an RF test signal substantially without affecting output of a signal at said output interface.

65. The receiver of claim 64, wherein said input interface, said transimpedance amplifier, said RF test point amplifier, and said output interface are integrated upon a same substrate to thereby provide an integrated circuit implementation.

* * * * *